Nov. 13, 1923. Re. 15,722

R. A. HEISING

SYSTEM FOR PRODUCING MODULATED WAVES

Original Filed Dec. 27, 1918

Inventor
Raymond A. Heising
by A. C. Mauel Atty.

Reissued Nov. 13, 1923.

Re. 15,722

UNITED STATES PATENT OFFICE.

RAYMOND A. HEISING, OF MILLBURN, NEW JERSEY, ASSIGNOR TO WESTERN ELECTRIC COMPANY, INCORPORATED, OF NEW YORK, N. Y., A CORPORATION OF NEW YORK.

SYSTEM FOR PRODUCING MODULATED WAVES.

Original No. 1,436,252, dated November 21, 1922, Serial No. 268,469, filed December 27, 1918. Application for reissue filed August 8, 1923. Serial No. 656,466.

*To all whom it may concern:*

Be it known that I, RAYMOND A. HEISING, a citizen of the United States of America, residing at Millburn, in the county of Essex and State of New Jersey, have invented certain new and useful Improvements in Systems for Producing Modulated Waves, of which the following is a full, clear, concise, and exact description.

This invention relates to the production of modulated high frequency electromagnetic waves by varying the current or voltage supplied to an arc in accordance with signals; for example, sound signals.

Objects of the invention are: (1) To provide signaling means wherein transmission is produced by uniformly recurring discharges of amounts of electricity which vary in accordance with signals: (2) To provide such means which are adapted for the transmission of speech: (3) To provide systems in which large currents, modulated in accordance with signals, may be efficiently generated by an arc: (4) To provide systems in which the frequency of arc discharges is maintained constant independently of variations in their amplitude: (5) To provide efficient variable impedance means for associating a microphone or equivalent with an arc generator in high frequency signaling systems.

Consideration of the following description will suggest other objects and advantages of the invention.

The variation in voltage of the current supplied to the arc is caused by a variable impedance either in shunt to, in series with the arc or otherwise suitably related thereto. The variable impedance preferably consists of a device of the electron discharge type. For telephony the discharge device is controlled by a microphone or equivalent element. Use is made of a third or auxiliary electrode of the arc for controlling the main arc discharge. By adjusting the constants in the auxiliary electrode circuit, the frequency can be controlled independently, in a large degree, of the amplitude variation due to the signals.

Figure 1:
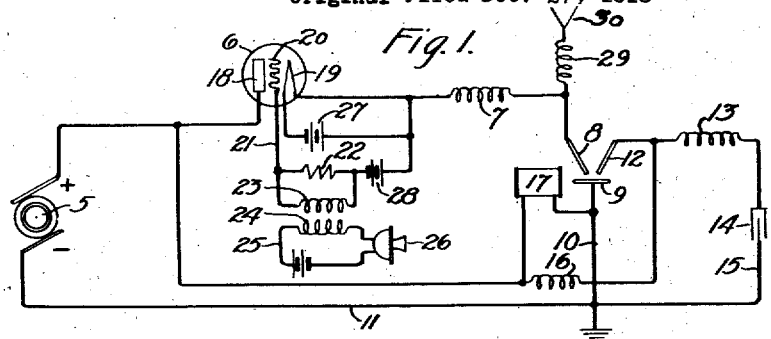
Figure 2:
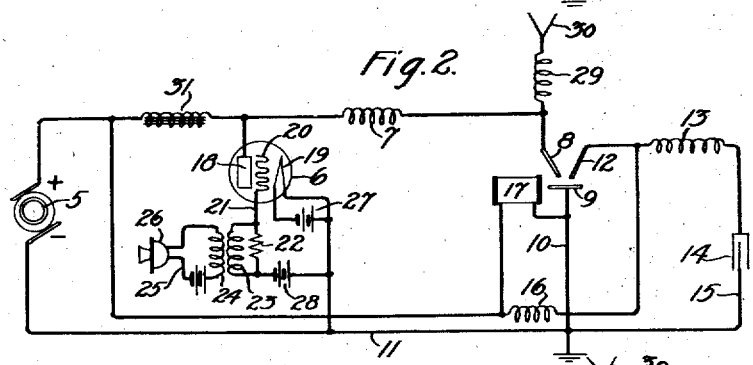
Figure 3:
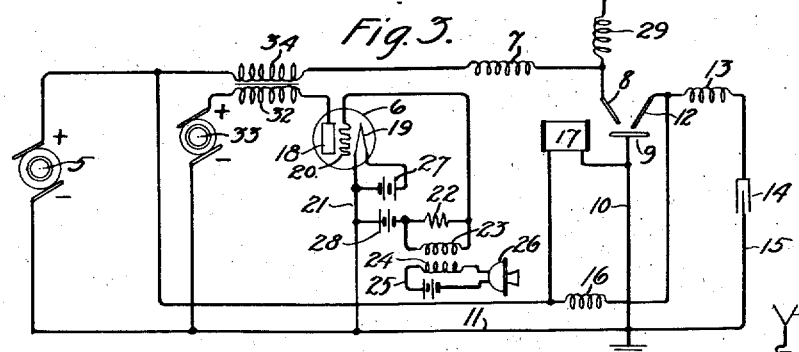
Figure 4:
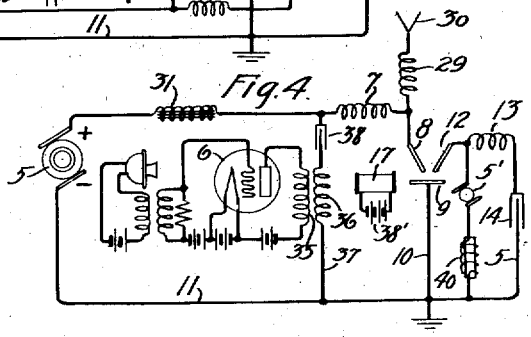

For more definite explanation of the invention, reference is made to the accompanying drawings wherein Fig. 1 represents a system having a discharge device in series with an arc; Fig. 2 a system having a discharge device in parallel with an arc; Figs. 3 and 4 are other modified forms, while Fig. 5 discloses an arrangement which may be utilized in connection with any of the preceding arrangements.

Referring particularly to Fig. 1, a generator 5 constitutes a source of direct current for supplying an arc circuit which comprises the anode-cathode path of the electron discharge device 6, the high frequency choke coil 7, the electrode 8, electrode 9 and conductors 10 and 11. The device 6 typifies either a single vacuum tube or a suitable system of such tubes in parallel or series relation. The material of which the electrodes 8 and 9 are composed, the space therebetween, and the maximum voltage across the electrodes, are so chosen that normally the discharge will not occur except as it is controlled, triggered, primed or tripped off by the discharge across the electrodes 12 and 9. The frequency of the discharges across electrodes 9 and 12 is controlled by the magnitudes of inductance 13 and capacity 14 in the control circuit 15, which circuit includes electrodes 12 and 9. The control circuit is energized by the source 5 but it is optional to provide a separate control source. The electromagnet 17 maintains a field across the space between electrodes 8, 12 and 9 which serves to extinguish the arc after each discharge. The magnet 17 is energized by source 5 but it is optional to provide a separate source as shown in Fig. 4. The device 6 includes an anode 18, a filamentary cathode 19 and a grid or impedance controlling element 20. Connected to the grid and the cathode is the input circuit 21 comprising resistance 22, shunted by the secondary 23 of a transformer to which is coupled the primary 24, said primary 24 being located in series with the controlling microphone or an equivalent device 26 in the circuit 25. The usual sources 27 and 28 are provided for heating the cathode and maintaining the grid negative with respect thereto respectively. The arc across the electrodes 8 and 9 is included in the path to ground of the antenna circuit which comprises inductance 29 and the serial 30. With proper adjustments the radiated frequency will be an approximate sine wave of the same frequency as the frequency of the discharges across electrodes 9 and 12.

Fig. 2 shows an arrangement in which the discharge device 6 is located in parallel instead of in series with the arc electrodes 8 and 9. Low frequency variations of voltage across device 6, due to the action of microphone 26, will cause negligible change of current through coil 31, due to its high inductance. The generator 5 may be regarded as a source of current which is maintained constant by coil 31, or the generator 5 and coil 31 together may be regarded as a source of constant current.

In Fig. 3 the output circuit of device 6 comprises primary 32 and a suitable source of direct current, such as a generator 33 or a battery. Coil 32 is coupled to coil 34 which thereby serves to impress low frequency variations of voltage across the path comprising the arc electrodes 8 and 9 which correspond to variations across the anode-cathode circuit of device 6. Coil 7 serves to prevent the shunting of high frequency oscillations around the arc to ground. This arrangement differs from that of Fig. 1 in that the device 6, instead of being in series with the current supply path of the arc is coupled to this path by means of a transformer 32, 34.

In Fig. 4 the device 6, instead of being in a path parallel to the arc supply circuit, as in Fig. 2, is coupled by means of transformer 35, 36 to a shunt path 37 which comprises capacity 38 and secondary 36. The microphone acts upon device 6 to vary the space current therethrough, and these variations in turn cause corresponding voltages to be induced in path 37. The electromagnet 17 may be supplied by a separate source 38′. The control circuit may also be energized by separate source 5′ in series with which an inductance 40 may be placed, if necessary.

The function of those elements of Figs. 2, 3 and 4 which are not given in detail, may be readily understood by reference to the description of the correspondingly numbered elements of Fig. 1.

Figure 5:
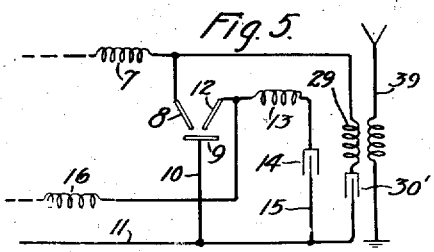

Fig. 5 illustrates a modified arrangement which may be utilized in connection with any of the preceding. The main oscillation circuit 29, 30′ is here substituted for the antenna circuit of the preceding figures. The antenna circuit 39 is coupled to the oscillation circuit by coil 29. By means of this arrangement the oscillations existing in the antenna will have a smaller proportion of harmonic frequencies. Intermediate tuned circuits may be placed between the oscillation circuit and the antenna 39 to more effectively eliminate the harmonics. Such tuned circuits are well known and therefore need no description. By substituting a transmission line for the antenna, this invention may be utilized for transmitting intelligence over conductive circuits.

Operation: The generator 5 supplies a direct voltage to the circuit 15 and condenser 14 which periodically discharges across the electrodes 9 and 12 and causes simultaneous discharge across the electrodes 8 and 9. The amplitude of the discharge across the electrodes 8 and 9 will depend largely upon the instantaneous condition of the device 6. Thus while the amplitude of the discharge may be made to vary, the frequency thereof will remain substantially constant. Although the discharge across electrodes 9, 12 may consist of a small amount of energy, it may serve to control the discharge of a much larger amount of energy across the electrodes 8, 9. The device 6 acts as an amplifier and reproduces in amplified form the impedance changes in or the current changes through the device 26. The antenna capacity or the equivalent capacity 30′ is continually being charged by the source 5, but the rate of charge varies in accordance with the condition of device 6.

Novel features inherent in the invention are defined in the appended claims.

What is claimed is:

1. A system comprising an arc generator, a direct current supply source for said generator, means for varying in accordance with sound waves the potential supplied by said source at a rate lower than the frequency generated by said generator, and means to prevent the operation of said first-mentioned means from materially changing the frequency generated by said generator.

2. A system comprising an arc generator, a direct current supply source therefor, and a non-periodic path including a signal controlled discharge device in shunt to said generator for varying at a low frequency rate the potential supplied by said source.

3. A system comprising an arc generator, a direct current energy source therefor, and an untuned path including a dischage device for shunting from said generator in accordance with sound waves the energy supplied by said source.

4. A system comprising an arc generator, a direct current supply source therefor, a discharge device for varying in accordance with electrical waves representing human speech the effective potential supplied by said source, and means to prevent the operation of said discharge device from materially changing the base frequency generated.

5. A system comprising a source of electric current, an arc device for transforming the energy from said source into high frequency alternating energy, a discharge device for controlling the instantaneous voltage supplied by said source, and a common source of constant current for supplying said devices.

6. A system comprising a source of electric current, an arc for transforming the energy from said source into high frequency alternating current whose amplitude is dependent upon the instantaneous magnitude of the voltage supplied by said source, a discharge device for controlling the voltage supplied by said source, and means for supplying said device with current from said source.

7. A system comprising an arc for transforming electrical energy into high frequency alternating current energy, an energy supply for said arc varying at a signaling frequency, and means operable without substantial time lag for preventing variations in said energy supply from affecting the frequency generated by said arc.

8. A system comprising an arc for transforming electrical current energy into high frequency oscillations, a current supply source for said arc, a speech controlled electric device for varying the current supply of said arc, and means operable with a time lag measurably less than the period of an audible sound wave for preventing variations in the current supply from varying the period of said oscillations.

9. A system for generating modulated high frequency waves, comprising an arc generator, a current supply source therefor, means adapted to be varied at a rate within the range of audibility for varying the current supplied from said source, and means for preventing variations at said rate in said current supply from varying the frequency of said generator.

10. A system comprising a main oscillation circuit, an arc device for generating oscillations in said circuit, a current supply means for said arc device, means adapted to be controlled in accordance with sound signals for varying the current supplied from said source, a control circuit for said arc, and means associating said circuit with said arc whereby the tendency of signaling variations in current supply to said arc to change the frequency of oscillations is counteracted.

11. A system comprising a main oscillation circuit, an arc device for generating oscillations in said circuit, a current supply means for said arc device, an electron discharge device for varying the current supplied from said means, and a trigger control circuit including inductance and capacity for said arc.

12. A system comprising a source of direct current, an arc, and an electron discharge device, said arc and said discharge device being in paths conductive to direct current which are in parallel with respect to said source.

13. A system comprising a source of energizing current, an arc, an electron discharge device, and means for varying the impedance of said discharge device, said arc and said discharge device being in paths conductive to direct current which are in parallel with respect to said source.

14. A system comprising a source of direct current, an arc, an electron discharge device, said arc and said discharge device being in paths conductive to direct current which are in parallel with respect to said source, and means to maintain the current through said source substantially constant.

15. In combination, a source of substantially constant current, an arc, and an electron discharge device, said arc and said device being in paths conductive to direct current which are in parallel with respect to said source.

16. A system comprising an arc, an electron discharge device, the terminals of said arc and said device being connected by conductors of negligible impedance for direct and speech frequency current, and a common source of electrical energy for supplying current to said arc and said device.

17. A system comprising a source of direct current, a speech frequency choke coil, a high frequency choke coil, and main arc electrodes, said aforementioned elements being located in a series circuit, a conductive path shunted across the high frequency choke coil and the arc, an electron discharge device operatively associated with said path, means including a microphone and an input circuit for controlling the impedance of said device, a high frequency oscillation circuit shunted around said electrodes, a control circuit including inductance and capacity shunted around said source of direct current, an auxiliary electrode for said arc, one portion of said control circuit being connected to one of said main electrodes and another portion to said auxiliary electrode, and means for maintaining a magnetic field across the space between said main and auxiliary electrodes.

18. A system comprising an arc, a source of current therefor, an electron discharge device having an anode, an electron emitting cathode, and an impedance controlling element, said arc and said device being in non-periodic paths which are in parallel with respect to said source.

19. A system comprising a source of current, means to vary the voltage supplied by said source at a low frequency rate, a discharge path for said source, and means operating independently of discharges across said path to cause discharges across said path at a high frequency rate which is substantially independent of the instantaneous voltage supplied by said source.

20. In combination, an arc, means for impressing thereon an electric potential varying in accordance with signals, means for extinguishing said arc, and means for priming said arc at a constant frequency rate.

21. The method of producing modulated oscillations in a circuit which comprises charging a capacity in the circuit, varying at a low frequency rate the charging current for said capacity, and causing the discharge of the capacity at a constant and relatively high rate.

22. The method which comprises causing a current to continuously flow to charge a capacity, varying the amperage of said current in accordance with speech, and periodically priming a discharge path to cause the capacity to discharge therethrough at a frequency which is high as compared with speech frequencies.

23. The method which comprises forcing a continuous current into a capacity, varying the rate of flow of the current at a comparatively low frequency, and priming a discharge path to cause the capacity to discharge therethrough at a radio frequency rate.

24. The method which comprises forcing a continuous current into a capacity variably impeding a shunt path around said capacity at a comparatively low frequency and discharging the capacity at a constant and relatively high frequency rate.

25. A system comprising an arc, a source of current therefor, highly evacuated unidirectionally conducting electron discharge device, an anode-cathode discharge path within said device, and means for varying the impedance of said path, said arc and said path being in paths conductive to direct current which are in parallel with respect to said source.

26. The method of operating a system comprising an arc and a space discharge device having an anode-cathode path, with means for controlling the impedance of said path, which comprises maintaining constant the sum of the currents through said arc and said device.

27. A system comprising an arc device, a space discharge device having an anode and an electron emitting cathode comprising terminals of a discharge path, a common source of electrical energy for said path and said arc, and means for varying the current to said arc by variably dissipating energy in said device.

28. A system comprising an arc, a space discharge device having an anode and an electron emitting cathode comprising terminals of a discharge path, means for energizing said cathode, a common source of current for said arc and device, and means for preventing variations in current supply from said source.

29. An arc system having main electrodes and means for impressing a variable voltage thereacross, an auxiliary electrode, a priming circuit connected to said auxiliary electrode, and a steady current supply for said priming circuit, said priming circuit and auxiliary electrode being arranged to prime said arc at regular intervals irrespective of voltage variations across said main electrodes.

30. In a constant frequency arc system, the combination of an oscillation circuit containing a normally inoperative arc gap, a trigger oscillation circuit containing a normally operative arc gap for priming said first mentioned arc gap, means for energizing said circuits, and means for producing a magnetic field across said gaps.

31. In a signaling system, a main oscillation circuit containing a normally inoperative arc gap, a trigger oscillation circuit containing a normally operative arc gap for priming said first mentioned arc gap, means for tuning said circuits to the same carrier frequency, means for energizing said circuits, means for producing a magnetic field across said gaps, and a load circuit associated with said main oscillating circuit.

32. In a constant frequency oscillating system, the combination of an oscillation circuit containing two electrodes, a second oscillation circuit containing one of said electrodes and a third electrode, means for producing a magnetic field in the space occupied by said electrodes, means for energizing said circuits, and translating means associated with one of said circuits.

33. In a constant frequency oscillating system, the combination of a main oscillation circuit containing an anode and a cathode, a trigger oscillation circuit containing said cathode and a second anode, said circuits also including means for tuning said circuits to substantially the same carrier frequency, means for energizing said circuits, means for producing a magnetic field across the gaps formed by said anodes and cathodes, and means for taking constant frequency oscillations from said main oscillation circuit.

34. In an oscillation generating system, a power generator of oscillations including an electric space discharge device having fixed electrodes, an oscillating system including an electric space discharge device having fixed electrodes, means for maintaining the oscillations of said power generator in frequency synchronism with said oscillating system, and an energy consumption circuit, said power generator being coupled to said energy consumption circuit and said oscillating system being more remotely associated with said energy consumption circuit through said power generator.

35. In combination, an energy storing circuit, means for charging said circuit, a discharge path for said circuit whose impedance is normally so great as to prevent discharge therethrough, a control circuit for said discharge path, means for charging said control circuit at a substantially uniform rate, a discharge path for said control circuit operative only when said circuit is charged to a predetermined degree, and means so associating said circuits that discharge of the control circuit lowers the impedance of the discharge path of the energy storing circuit to the discharging point.

36. An oscillation generator comprising an oscillating arc circuit having a constant natural period, an oscillating arc circuit having a variable natural period, and means for producing oscillations in said second circuit of constant frequency controlled by said first circuit.

37. A system for generating oscillations of constant carrier frequency and modulating the oscillations in accordance with a variable signal wave which comprises an oscillating arc circuit having a constant natural period, an oscillating arc circuit having a period which tends to vary as the signal wave varies, and means for producing oscillations in said second circuit of substantially constant frequency controlled by the first circuit.

In witness whereof I hereunto subscribe my name this 30th day of July, A. D. 1923.

RAYMOND A. HEISING.